(12) United States Patent
Ito

(10) Patent No.: US 11,558,029 B2
(45) Date of Patent: Jan. 17, 2023

(54) ACOUSTIC WAVE DEVICE AND COMMUNICATION APPARATUS

(71) Applicant: KYOCERA Corporation, Kyoto (JP)

(72) Inventor: Motoki Ito, Ikoma (JP)

(73) Assignee: KYOCERA Corporation, Kyoto (JP)

( * ) Notice: Subject to any disclaimer, the term of this patent is extended or adjusted under 35 U.S.C. 154(b) by 377 days.

(21) Appl. No.: 16/646,913

(22) PCT Filed: Sep. 11, 2018

(86) PCT No.: PCT/JP2018/033613
§ 371 (c)(1),
(2) Date: Mar. 12, 2020

(87) PCT Pub. No.: WO2019/054364
PCT Pub. Date: Mar. 21, 2019

(65) Prior Publication Data
US 2020/0304098 A1     Sep. 24, 2020

(30) Foreign Application Priority Data
Sep. 14, 2017 (JP) .............................. JP2017-176901

(51) Int. Cl.
*H03H 9/05* (2006.01)
*H03H 9/25* (2006.01)
*H01L 41/047* (2006.01)

(52) U.S. Cl.
CPC ........... *H03H 9/059* (2013.01); *H01L 41/047* (2013.01); *H03H 9/25* (2013.01)

(58) Field of Classification Search
CPC ........... H01L 2224/16225; H01L 23/29; H01L 23/31; H01L 25/00; H01L 25/04; H01L 25/18; H01L 2924/00012; H01L 2924/181; H01L 41/047; H03H 9/02834; H03H 9/0542; H03H 9/059; H03H 9/1071; H03H 9/1085; H03H 9/25
(Continued)

(56) References Cited

U.S. PATENT DOCUMENTS

| | | | | |
|---|---|---|---|---|
| 4,598,587 A | * | 7/1986 | Dwyer | G01P 15/0975 310/329 |
| 5,438,305 A | * | 8/1995 | Hikita | H01L 23/66 333/32 |

(Continued)

FOREIGN PATENT DOCUMENTS

| JP | 2013-110299 A | 6/2013 |
|---|---|---|
| JP | 2017-98300 A | 6/2017 |

(Continued)

*Primary Examiner* — Tan H Trinh
(74) *Attorney, Agent, or Firm* — Procopio Cory Hargreaves and Savitch LLP

(57) ABSTRACT

A SAW device includes a mounting substrate including a mounting surface, a SAW chip mounted on the mounting surface, a dummy chip mounted on the mounting surface, and a resin part covering the acoustic wave chip and the dummy chip. The dummy chip includes an insulating dummy substrate, and one or more dummy terminals which are located on a surface of the dummy substrate on the mounting surface side and are bonded to the mounting surface. The dummy chip configures an open end when electrically viewed from the mounting substrate side.

11 Claims, 9 Drawing Sheets

(58) Field of Classification Search
USPC ...... 310/313 R, 329; 333/32, 195, 238, 187; 361/810
See application file for complete search history.

(56) References Cited

U.S. PATENT DOCUMENTS

| | | | | |
|---|---|---|---|---|
| 5,450,287 | A * | 9/1995 | Ujiie | H01L 23/055 |
| | | | | 361/810 |
| 6,928,719 | B2 * | 8/2005 | Kim | H03H 9/1078 |
| | | | | 29/841 |
| 2001/0028286 | A1 * | 10/2001 | Takamine | H03H 9/0028 |
| | | | | 333/195 |
| 2004/0075362 | A1 * | 4/2004 | Inoue | H03H 9/6483 |
| | | | | 310/313 R |
| 2007/0210876 | A1 * | 9/2007 | Yahata | H01P 1/268 |
| | | | | 333/187 |
| 2008/0211604 | A1 * | 9/2008 | Katayama | H01P 5/08 |
| | | | | 333/238 |
| 2012/0181898 | A1 * | 7/2012 | Hatakeyama | H03H 9/058 |
| | | | | 310/313 B |
| 2015/0008789 | A1 | 1/2015 | Iwamoto | |
| 2015/0028966 | A1 | 1/2015 | Iwamoto | |
| 2016/0234929 | A1 * | 8/2016 | Lee | H05K 3/4605 |
| 2017/0141066 | A1 | 5/2017 | Toyota | |

FOREIGN PATENT DOCUMENTS

| | | |
|---|---|---|
| WO | 2013/141184 A1 | 9/2013 |
| WO | 2013/146374 A1 | 10/2013 |

* cited by examiner

ACOUSTIC WAVE DEVICE AND COMMUNICATION APPARATUS

TECHNICAL FIELD

The present disclosure relates to an acoustic wave device utilizing an acoustic wave and to a communication apparatus including the acoustic wave device. The acoustic wave is for example a surface acoustic wave (SAW).

BACKGROUND ART

Known in the art is an acoustic wave chip which has a piezoelectric substrate and has an excitation electrode positioned on the piezoelectric substrate and supplies voltage to the piezoelectric substrate by the excitation electrode to thereby excite an acoustic wave propagating through the piezoelectric substrate. Further, there is also known an acoustic wave device having such an acoustic wave chip, a mounting substrate on which the acoustic wave chip is mounted, and a resin part covering (sealing) the acoustic wave chip (for example Patent Literature 1). In Patent Literature 1, two acoustic wave chips are mounted on one mounting substrate and the two acoustic wave chips are sealed by resin together.

CITATION LIST

Patent Literature

Patent Literature 1: International Patent Publication No. 2013/141184

SUMMARY OF INVENTION

An acoustic wave device according to one aspect of the present disclosure includes a mounting substrate includes a mounting surface, an acoustic wave chip mounted on the mounting surface, a dummy chip mounted on the mounting surface, and a resin part covering the acoustic wave chip and the dummy chip. The dummy chip includes an insulating dummy substrate and one or more dummy terminals which are located on a surface of the dummy substrate on the mounting surface side and are bonded to the mounting surface. The dummy chip configures an open end when electrically viewed from the mounting substrate side.

An acoustic wave device according to another aspect of the present disclosure includes a mounting substrate includes a mounting surface, a first chip which is mounted on the mounting surface, a second chip which is mounted on the mounting surface, and a resin part covering the first chip and the second chip. The first chip includes a first piezoelectric substrate, a support substrate which is bonded to the first piezoelectric substrate, and a first IDT (interdigital transducer) electrode which is located on a surface of the first piezoelectric substrate on an opposite side to the support substrate. The support substrate is lower in thermal expansion coefficient than the first piezoelectric substrate and is thicker than the first piezoelectric substrate. The first chip is mounted on the mounting surface with the first IDT electrode side made to face the mounting surface. The second chip includes a second piezoelectric substrate which is thicker than a total thickness of the first piezoelectric substrate and the support substrate. A top surface of the resin part on an opposite side to the mounting surface is flat over a top of the first chip and a top of the second chip.

A communication apparatus according to still another aspect of the present disclosure includes the acoustic wave device described above, an antenna which is connected with the acoustic wave device, and an IC (integrated circuit) which is connected with the acoustic wave device.

DESCRIPTION OF EMBODIMENTS

Figure 1A:
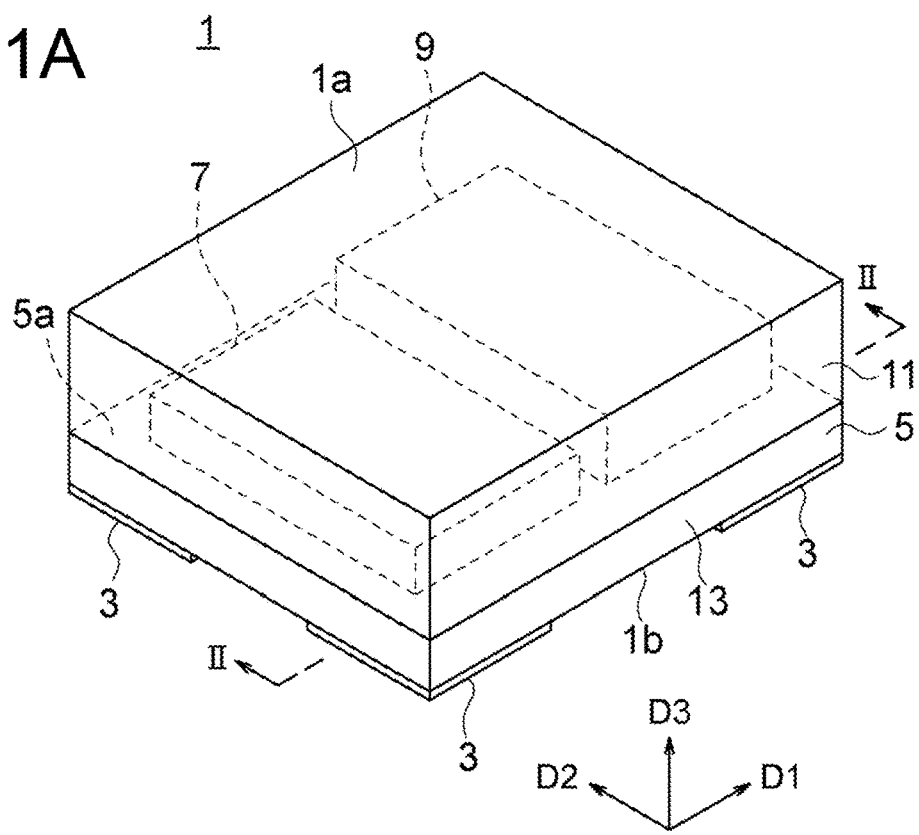
FIG. 1A and FIG. 1B are perspective views showing an outer appearance of a SAW device according to a first embodiment.

Below, embodiments according to the present disclosure will be explained with reference to the drawings. Note that, the following drawings are schematic ones. Therefore, details will be sometimes omitted. Further, size ratios etc. do not always coincide with the actual ones. Further, size ratios among the plurality of drawings do not always coincide with each other.

In the drawings, for convenience, sometimes an orthogonal coordinate system comprised of a D1 axis, D2 axis, and D3 axis will be attached. In the acoustic wave device according to the present disclosure, any direction may be defined as "above" or "below". However, for convenience, sometimes use will made of the terms as if the D3 axis direction were a vertical direction.

In the second and following embodiments, for the configurations which are common or similar to the configurations in the already explained embodiments, sometimes the notations which were attached to the configurations in the already explained embodiments will be used. Further, sometimes illustration and explanations will be omitted. Note that, for configurations corresponding (similar) to the configurations in the already explained embodiments, even in a case where notations which are different from those for the configurations in the already explained embodiments are attached, points not particularly explained otherwise are the same in configurations as those in the already explained embodiments.

First Embodiment (Overall Configuration of SAW Device)

Figure 1B:
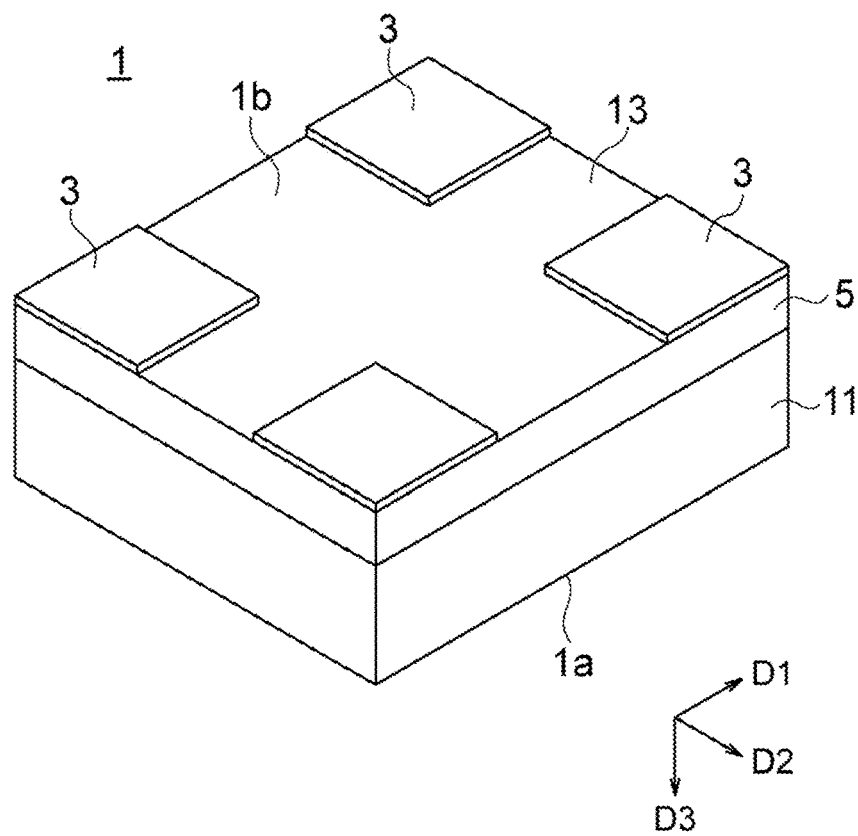

FIG. 1A is a perspective view showing an outer appearance of a SAW device 1 according to a first embodiment when viewed from a top surface 10a side. FIG. 1B is a perspective view showing the outer appearance of the SAW device 1 when viewed from a bottom surface 1b side.

The SAW device 1 is for example formed in a schematically rectangular cuboid shape. The size of the SAW device 1 may be suitably set. When explaining one example, the length of one side when viewed on a plane is 1 mm to 5 mm, and the thickness is 0.3 mm to 1 mm. At the bottom surface 1b of the SAW device 1, a plurality of external terminals 3 are exposed.

The SAW device 1 is for example arranged with the bottom surface 1b made to face a not shown circuit board and is mounted on the circuit board by bonding pads provided on the circuit board and the plurality of external terminals 3 through bumps made of solder or the like. Further, the SAW device 1 receives as input an electrical signal through any of the plurality of external terminals 3, performs predetermined processing on the input electrical signal, and outputs the result from any of the plurality of external terminals 3.

Figure 2:
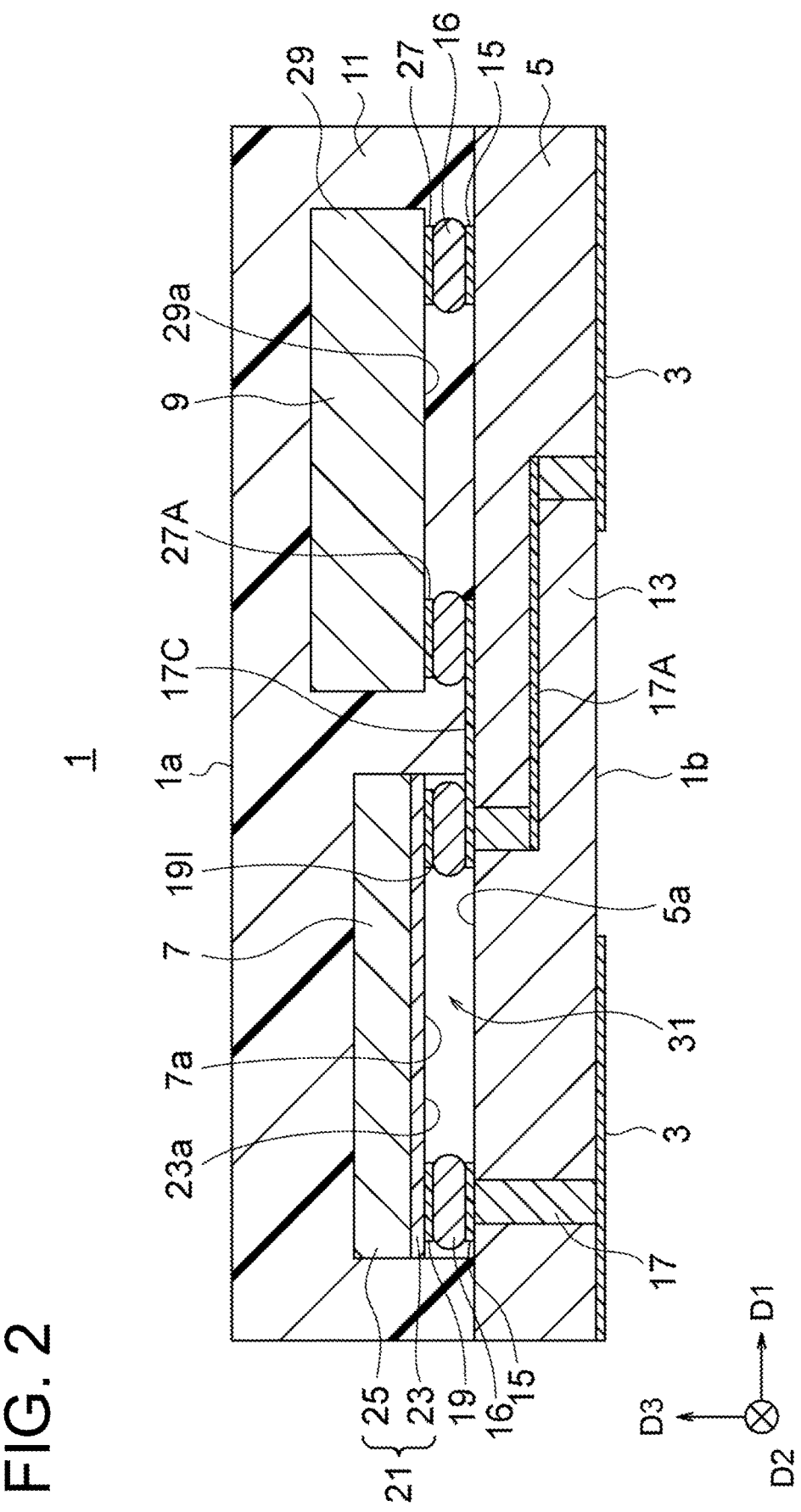
FIG. 2 is a cross-sectional view taken along the II-II line in FIG. 1A.

FIG. 2 is a cross-sectional view taken along the II-II line in FIG. 1A.

As shown in FIG. 1A, FIG. 1B, and FIG. 2, the SAW device 1 for example has a mounting substrate 5, a SAW chip 7 and a dummy chip 9 which are mounted on the mounting substrate 5, and a resin part 11 covering (sealing) the SAW chip 7 and dummy chip 9. The SAW chip 7 and dummy chip 9 are for example mounted on the mounting substrate 5 by bumps 16.

(Mounting Substrate)

The mounting substrate 5 for example configures a package (notation is omitted) for packaging the SAW chip 7 together with the resin part 11. One major surface of the mounting substrate 5 becomes a mounting surface 5a on which electronic components (SAW chip 7 and dummy chip 9 in the present embodiment) are mounted. Further, the mounting substrate 5 has the external terminals 3 explained above on the other major surface.

Note that, the "major surface" for example designates the broadest surface in a plate-shaped member. That is, the major surface designates the front surface or back surface of the plate-shaped member. The same is true below.

The mounting substrate 5 is for example configured by a rigid type printed circuit board and has an insulating base body 13 and conductors provided on the surface or inside of the base body 13.

The base body 13 is for example schematically formed in a thin rectangular cuboid shape. Further, the base body 13 is for example formed including a resin, ceramic and/or amorphous state inorganic material. The base body 13 may be one configured by a single material or may be one configured by a composite material like a substrate comprised of a base material in which a resin is impregnated.

The conductors of the mounting substrate 5 for example include the already explained plurality of external terminals 3, a plurality of mounting pads 15 for mounting the electronic components (7 and 9), and a plurality of wirings 17 connecting the plurality of mounting pads 15 and the plurality of external terminals 3. The materials for these conductors may be Cu or another suitable metal. Note that, although not particularly shown, the conductors of the mounting substrate 5 may configure an electronic component such as a capacitor or inductor or may configure a suitable electronic circuit.

The external terminals 3 are for example configured by layered conductors which are superposed on the major surface of the base body 13 on the negative side along the D3 axis. The planar shape and various dimensions thereof may be suitably set. Further, the number, positions, and roles of the plurality of external terminals 3 may be suitably set in accordance with the configurations etc. inside the SAW device 1. In the present embodiment, a case where four external terminals 3 are provided at four corners of the bottom surface 1b is illustrated.

The mounting pads 15 are for example configured by layered conductors which are provided on the major surface of the base body 13 on the positive side along the D3 axis. The planar shapes and various dimensions thereof may be suitably set. The mounting pad 15 for mounting the SAW chip 7 and the mounting pad 15 for mounting the dummy chip 9 may be the same as each other or may be different from each other in materials, planar shapes, and/or various dimensions. For example, they are the same as each other. The number, positions, and roles of the plurality of mounting pads 15 basically correspond to the number, positions, and roles of the terminals of the electronic components (7 and 9) mounted on the mounting substrate 5. This will be explained later.

The plurality of wirings 17 for example include a plurality of wirings 17A connecting the plurality of mounting pads 15 and the plurality of external terminals 3. The wirings 17A for example include via conductors (notation is omitted) penetrating through the base body 13 in the thickness direction. Further, they include layered conductors (notation is omitted) which are positioned on the major surface or inside of the base body 13 and are parallel to the major surface according to need. The various dimensions of the via conductors and layered conductors may be suitably set. The plurality of wirings 17, other than the plurality of wirings 17A, may have wirings connecting the mounting pads 15 to each other or wirings connecting the external terminals 3 to each other according to the configurations of the electronic components (5, 7) mounted on the mounting surface 5a.

(SAW Chip)

The SAW chip 7 is for example formed in a schematically thin rectangular cuboid shape. Further, the SAW chip 7 for example has a plurality of chip terminals 19 exposed at a major surface 7a on the negative side along the D3 axis. The SAW chip 7 is for example arranged with the major surface 7a made to face the mounting surface 5a of the mounting substrate 5 and is mounted on the mounting surface 5a by bonding the mounting pads 15 and the chip terminals 19 by the bumps 16.

The mounting surface 5a of the mounting substrate 5 and the major surface 7a of the SAW chip 7 are for example separated from each other by the total thickness of the thicknesses of the mounting pad 15, bumps 16, and chip terminals 19. A clearance is formed between the two. As will be understood from the explanation which will be given later, in the present embodiment, this clearance is utilized as a vibration space 31 facilitating the propagation of the SAW.

Further, the SAW chip 7 for example receives as input an electrical signal through any of the plurality of chip terminals 19, performs predetermined processing on the input electrical signal, and outputs the result from any of the plurality of chip terminals 19. At this time, the SAW chip 7 performs conversion from the electrical signal to the SAW and conversion from the SAW to the electrical signal.

The SAW chip 7 for example has an insulating chip substrate 21 and conductors provided on the surface of the chip substrate 21.

(Chip Substrate)

The chip substrate 21 is for example a schematically thin rectangular cuboid shape. In the present embodiment, the outer shape of the SAW chip 7 is substantially the same as the outer shape of the chip substrate 21. The chip substrate 21 is for example configured by so-called bonded substrates. That is, the chip substrate 21 has a piezoelectric substrate 23 and a support substrate 25 which is bonded to one major surface of the piezoelectric substrate 23. Note that, the major surface 23a of the piezoelectric substrate 23 on the opposite side to the support substrate 25 configures the major surface 7a of the SAW chip 7 in the present embodiment.

The piezoelectric substrate 23 is for example configured by a single crystal substrate having a piezoelectric characteristic. The single crystal substrate is for example comprised of lithium tantalate ($LiTaO_3$), lithium niobate ($LiNbO_3$), or quartz crystal ($SiO_2$). The cut angle, planar shape, and various dimensions may be suitably set. In the present embodiment, the piezoelectric substrate 23 is rectangular.

The support substrate 25 is for example formed by a material having a smaller thermal expansion coefficient than the material for the piezoelectric substrate 23. Due to this, for example, a change of the electrical characteristics of the SAW chip 7 due to a temperature can be compensated for. As such a material, for example, there can be mentioned a silicon or another semiconductor, sapphire or another single crystal, and an aluminum oxide sintered body or other ceramic. Note that, the support substrate 25 may be configured by laminating a plurality of layers which are made of different materials from each other as well. The support substrate 25 is for example given a shape and dimensions matching with the piezoelectric substrate 23 when viewed on a plane. The thickness of the support substrate 25 is for example thicker than the thickness of the piezoelectric substrate 23.

The piezoelectric substrate 23 and the support substrate 25 are for example bonded to each other through a not shown bonding layer. The material for the bonding layer may be an organic material or inorganic material. As an organic material, for example there can be mentioned a thermosetting resin or other resin. As the inorganic material, for example there can be mentioned $SiO_2$. Further, the piezoelectric substrate 23 and the support substrate 25 may be bonded by so-called direct bonding activating the bonding surfaces by plasma or the like, then bonding the bonding surfaces to each other without a bonding layer.

(Dummy Chip)

The dummy chip 9 is for example schematically formed in a thin rectangular cuboid shape. Further, the dummy chip 9 has a plurality of dummy terminals 27 which are exposed at the major surface on the negative side along the D3 axis. The dummy chip 9 is for example arranged making the major surface at which the plurality of dummy terminals 27 are exposed face the mounting surface 5a of the mounting substrate 5 and is mounted on the mounting surface 5a by bonding the mounting pads 15 and the dummy terminals 27 by the bumps 16.

The dummy chip 9 is mounted on the mounting surface 5a in the same way as the SAW chip 7, therefore the two chips are aligned on the mounting surface 5a. The direction of arrangement of the same may be a suitable direction. Note that, for example, if the SAW chip 7 and dummy chip 9 are rectangular shaped when viewed on a plane and are arranged so that single sides of the two are parallel to each other as in the example shown, the direction of arrangement may be a direction perpendicular to the single sides. When not able to be specified in this way, the direction of arrangement may be a direction of a line connecting the centroids of the chips when viewed on a plane.

In the present embodiment, as will be understood from the explanation which will be given later, the direction of arrangement is the direction of propagation of the SAW (D1 axis direction) in the SAW chip 7. From another viewpoint, the dummy chip 9, when viewed in the direction of propagation of the SAW, overlaps the SAW chip 7. The amount of overlap in the direction (D2 axis direction) along the mounting surface 5a and perpendicular to the direction of propagation at this time is for example a half or more or ⅔ or more of the length in the D2 axis direction of the SAW chip 7. In the example shown, the amount is the entire length in the D2 axis direction of the SAW chip 7.

Note that, the direction of arrangement of the SAW chip 7 and dummy chip 9 may be a direction other than the direction of propagation of the SAW (for example a direction perpendicular to the direction of propagation of the SAW). From another viewpoint, when viewed in the direction of propagation of the SAW, the dummy chip 9 need not overlap the SAW chip 7.

The dummy chip 9 is adjacent to the SAW chip 7. That is, no other electronic component is interposed between the two. However, another electronic component may be interposed as well. The distance between the dummy chip 9 and the SAW chip 7 may be suitably set. For example, the distance of the two (for example the shortest distance where the side surfaces which face each other are not parallel, same is true for the following explanation) is ½ or less, ⅕ or less, or 1/10 or less of the length of the SAW chip 7 in the arrangement direction of the two and/or the direction of propagation of the SAW (D1 axis direction). Otherwise, the distance of the two is 2 times or less or 1 time or less relative to the shortest distance between the SAW chip 7 and the edge part of the mounting surface 5a when viewed on a plane.

Note that, in a case where another electronic component is mounted on the mounting substrate 5 and this other electronic component is not interposed between the dummy chip 9 and the SAW chip 7 when viewed on a plane, the distance between the dummy chip 9 and the SAW chip 7 may be shorter than, equal to, or longer than the distance between the other electronic component and the SAW chip 7. For example, it is shorter.

The thickness of the dummy chip 9 for example may be thinner than, equal to, or thicker than the thickness of the SAW chip 7. In the example shown, it is thicker. In the case where the thickness of the dummy chip 9 is thicker than the thickness of the SAW chip 7 as in the example shown, the degree may be suitably set. For example, the thickness of the dummy chip 9 is 1.1 times or more or 1.3 times or more of the thickness of the SAW chip 7. Further, for example, a difference of the thicknesses when the dummy chip 9 is thicker than the SAW chip 7 is not more than the thickness of the SAW chip 7.

Relating to the above, the height from the mounting surface 5a of the mounting substrate 5 up to the surface of the dummy chip 9 on the positive side along the D3 axis (surface on the opposite side to the mounting surface 5a) may be lower than, equal to, or higher than the height from the mounting surface 5a up to the surface of the SAW chip 7 on the positive side along the D3 axis. In the example shown, it is higher. In the case where the dummy chip 9 is higher than the SAW chip 7 as in the example shown, the degree thereof may be suitably set. For example, the height of the dummy chip 9 is 1.1 times or more or 1.3 times or more of the height of the SAW chip 7. Further, for example, the difference of the heights when the dummy chip 9 is higher than the SAW chip 7 is less than the height of the SAW chip 7.

The dimensions of the dummy chip 9 when viewed on a plane may be suitably set. For example, when viewed on a plane, the area of the dummy chip 9 may be smaller than, equal to, or larger than that of the SAW chip 7. Further, either of the lengths of the dummy chip 9 and the SAW chip 7 in the direction (D2 axis direction) perpendicular to the direction of arrangement of the two may be larger than or equal to the other (example shown).

The dummy chip 9 for example has an insulating dummy substrate 29 and conductors provided on the surface of the dummy substrate 29. In the present embodiment, the shape and dimensions of the dummy substrate 29 are schematically equal to the shape and dimensions of the dummy chip 9, therefore the explanation about the shape and dimensions of the dummy chip 9 described above may be given as the explanation for the dummy substrate 29.

The insulation material configuring the dummy substrate 29 may be a suitable one. For example, the material for the dummy substrate 29 is a piezoelectric body, glass, quartz crystal, resin, ceramic, and/or inorganic material in an amorphous state. The dummy substrate 29 may be one configured by a single material or may be one configured by a composite material like a substrate comprised of a base material in which a resin is impregnated.

In the case where the material for the dummy substrate 29 is a piezoelectric body, the piezoelectric body may be a material which can be utilized as the material for the piezoelectric substrate 23 of the SAW chip 7 or a piezoelectric substrate in another acoustic wave chip or need not be such a material. Further, in the former case, the piezoelectric body configuring the dummy substrate 29 may be the same as or different from the material for the piezoelectric substrate 23 in the SAW chip 7 which is actually mounted on the mounting substrate 5 together (the cut angle need not be taken into account either).

(Resin Part)

The resin part 11 for example covers the mounting surface 5a of the mounting substrate 5 from the tops of the SAW chip 7 and dummy chip 9. More specifically, the resin part 11 for example substantially abuts against the surface of the SAW chip 7, the surface of the dummy chip 9, and the entirety of the mounting surface 5a. The abutting portions are basically made to closely contact each other (are bonded).

However, the resin part 11 is not filled between the major surface 7a of the SAW chip 7 and the mounting surface 5a (vibration space 31). In other words, the vibration space 31 is air-tightly sealed by the resin part 11. The interior of the vibration space 31 may be evacuated or may be sealed with a suitable gas.

Note that, the resin part 11 may somewhat enter into the clearance between the major surface 7a and the mounting surface 5a. Conversely, it may be retracted to the somewhat outer side of the clearance. Further, in the clearance between the dummy chip 9 and the mounting surface 5a as well, the resin part 11 need not be arranged and the clearance may be made a sealed space. Between the SAW chip 7 (and dummy chip 9) and the resin part 11, a not shown film may be interposed as well (however, this film may be grasped as a part of the resin part as well).

The resin part 11 forms the outer shape of the SAW device 1 together with the mounting substrate 5. The outer shape of the resin part 11 is for example a rectangular cuboid shape matching with the mounting substrate 5 when viewed on a plane. The top surface of the resin part 11 configures the top surface 1a of the SAW device 1. It is for example flat over the SAW chip 7 and dummy chip 9. In the present embodiment, the heights of the SAW chip 7 and the dummy chip 9 from the mounting surface 5a are different from each other (the former is lower than the latter). Therefore, in the resin part 11, the thickness above the SAW chip 7 and the thickness above the dummy chip 9 are different from each other (the former is thicker than the latter). Note that, the thickness above the SAW chip 7 in the resin part 11 may be a suitable size from various viewpoints such as a viewpoint of protection of the SAW chip 7.

The resin part 11 is configured by a resin. The resin is for example a thermosetting resin, and the thermosetting resin is for example an epoxy resin or phenol resin. In the resin, a filler made of insulating particles formed by a material having a lower thermal expansion coefficient than that of the resin may be mixed in as well. The material for the insulating particles is for example silica, alumina, phenol, polyethylene, glass fiber, and a graphite filler.

(Bumps)

The bumps 16 are for example comprised of solder. The solder may be a solder using lead or may be a lead-free solder. Note that, the bumps 16 may be formed by a conductive binder as well. The bumps 16 for mounting the SAW chip 7 and the bumps 16 for mounting the dummy chip 9 are for example comprised of the same material. The heights etc. of the bumps 16 may be suitably set. The heights of the bumps 16 for mounting the SAW chip 7 and the heights of the bumps 16 for mounting the dummy chip 9 may be the same as or different from each other. In the example shown, the heights of the bumps 16 are made equal.

(Conductors of SAW Chip)

Figure 3:
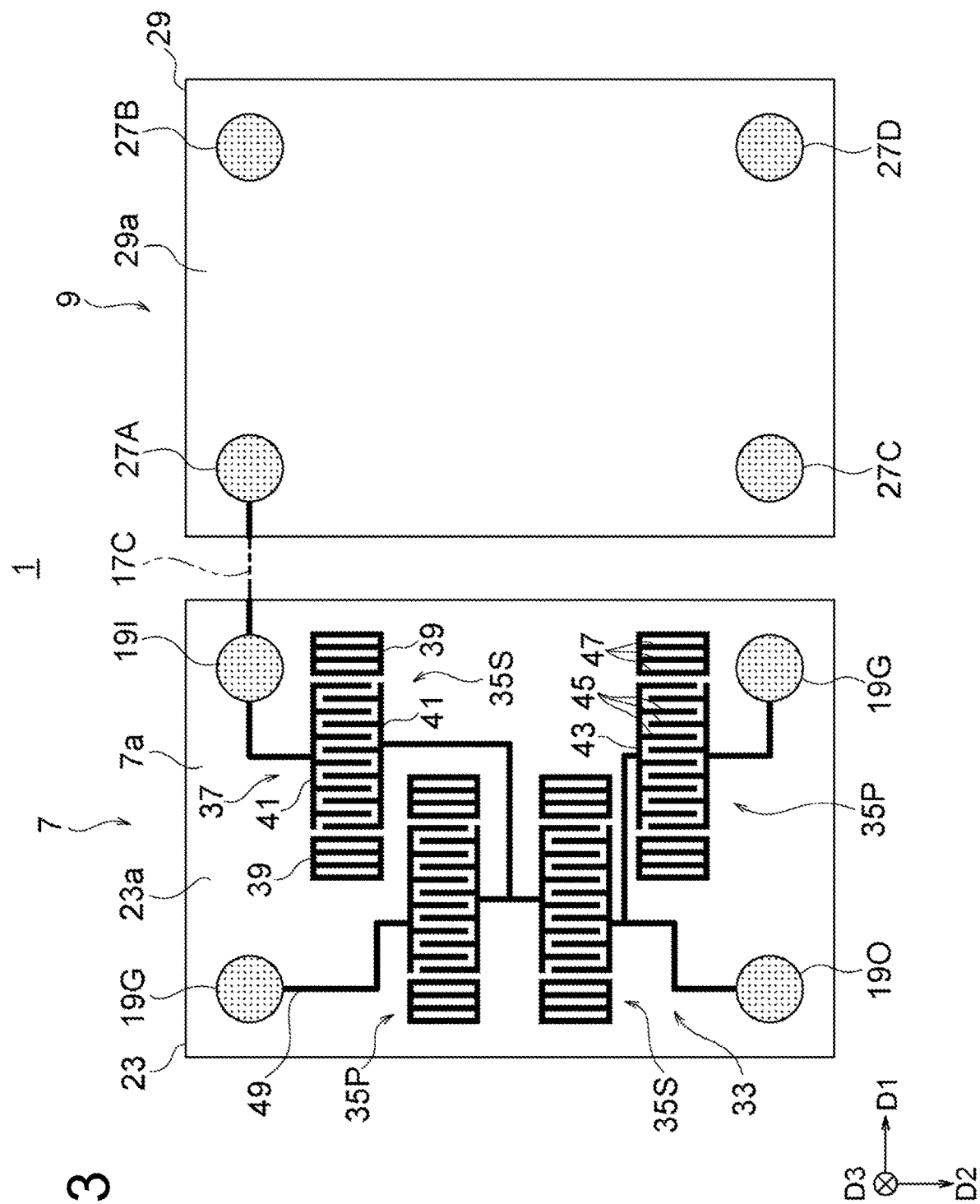
FIG. 3 is a plan view schematically showing a SAW chip and a dummy chip in the SAW device in FIG. 1.

FIG. 3 is a schematic plan view of the SAW chip 7 and dummy chip 9 from the negative side along the D3 axis. In the same view, regions given hatching and blacked out lines (excluding the outer edges of the chip) show layered conductors which are positioned at the surfaces of the chips (7, 9) on the negative side along the D3 axis.

As explained above, the SAW chip 7 has a plurality of (four in the example shown) chip terminals 19. The plurality of chip terminals 19 are for example configured by layered conductors which are superposed on the major surface 23a of the piezoelectric substrate 23 on the negative side of the D3 axis. The positions of the plurality of chip terminals 19 may be suitably set. For example, the plurality of chip terminals 19 are arranged along the outer edges of the major surface 23a of the piezoelectric substrate 23.

The plurality of chip terminals 19 for example include at least one input terminal 19I receiving as input a signal, at least one output terminal 19O outputting the signal, and at least one reference potential terminal 19G given the reference potential. Note that, the numbers of the input terminal 19I, output terminal 19O, and reference potential terminal 19G may be different from those in the example shown as well. The relative positions of these terminals may be suitably set.

The SAW chip 7 for example has a SAW filter 33 which filters the signal input to the input terminal 19I and outputs the result to the output terminal 19O. In the example shown, the SAW filter 33 is configured by a so-called ladder type filter.

A ladder type filter for example has a plurality of (may be one, two in the example shown) serial resonators 35S which are connected in series between the input terminal 19I and the output terminal 19O and a plurality of (may be one, two in the example shown) parallel resonators 35P (parallel arms) connecting the above serial line (serial arm) and the reference potential terminal 19G. Note that, in the following explanation, they will be simply referred to as the "resonators 35", and sometimes the serial resonators 35S and the parallel resonators 35P will not be differentiated.

The resonator 35 is for example configured by a so-called 1-port SAW resonator and includes an IDT (interdigital transducer) electrode 37 positioned on the major surface 23a of the piezoelectric substrate 23 and a pair of reflectors 39 which are positioned on the two sides of the IDT electrode 37. These are for example configured by layered conductors superposed on the major surface 23a.

The IDT electrode 37 includes a pair of comb-shaped electrodes 41 which are arranged so as to intermesh with each other. The comb-shaped electrodes 41 for example include bus bars 43 and pluralities of electrode fingers 45 extending from the bus bars 43 alongside each other. The bus bars 43 substantially extend in the direction of propagation of the SAW (D1 axis direction). The pluralities of electrode fingers 45 substantially extend in the direction (D2 axis direction) perpendicular to the direction of propagation of the SAW and are arranged in the direction of propagation of the SAW.

The reflectors 39 are for example formed in lattice shapes having pluralities of strip electrodes 47 which extend alongside each other in the direction perpendicular to the direction of propagation of the SAW. Each of the reflectors 39 may be for example made electrically floating states (example shown) or may be given the reference potential.

The various dimensions such as the pitch of the plurality of electrode fingers 45 may be suitably set in accordance with the characteristics requested from the resonators 35. FIG. 3 is a schematic view, therefore smaller numbers of electrode fingers 45 and strip electrodes 47 are shown. However, in actuality, larger numbers of electrode fingers 45 and strip electrodes 47 than those shown may be provided.

In the example shown, typical shapes of the IDT electrode 37 and reflectors 39 are shown. However, the shapes of these electrode etc. may be various known ones. For example, the electrode shape may be a so-called apodized shape, a shape provided with a so-called dummy electrode, a shape with bus bars 43 inclined in the direction of propagation of the SAW, or the like.

When voltage is supplied to the major surface 23a of the piezoelectric substrate 23 by the IDT electrode 37, for example, a SAW propagating through the major surface 23a in the D1 axis direction is excited, and a standing wave of a SAW having the pitch of the electrode fingers 45 as a half wavelength stands. The signal generated due to this standing wave is extracted by the IDT electrode 37. In this way, resonance in the resonator 35 is utilized.

The plurality of chip terminals 19 and the plurality of resonators 35 are connected with each other by the plurality of wirings 49. The plurality of wirings 49 are for example configured by layered conductors superposed on the major surface 23a of the piezoelectric substrate 23. The widths of the wirings 49, the positions on the major surface 23a and the like may be suitably set. For example, the widths of the wirings 49 may be made broader than the example shown. In the example shown, the plurality of wirings 49 do not include parts three-dimensionally intersecting through an insulator. However, they may include such parts as well.

The IDT electrode 37, reflectors 39, and wirings 49 are for example configured by the same materials and thicknesses as each other. The layered conductors configuring them are for example Al or another metal. The layered conductors may be configured by a plurality of metal layers as well. The thicknesses of the layered conductors are suitably set in accordance with the electrical characteristics etc. which are demanded from the resonators 35. As one example, the thicknesses of the layered conductors are 50 nm to 600 nm.

The chip terminals 19 for example may be configured by the same materials and thicknesses as those of the materials configuring the IDT electrodes 37 etc. or may be configured by layers made by the same materials and the same thicknesses and the other layers made of other materials superposed on the former layers.

Note that, although not particularly shown, the major surface 23a of the piezoelectric substrate 23 may be covered by a protective layer made of $SiO_2$, $Si_3N_4$ or the like from the tops of the IDT electrodes 37 and other conductors as well. On the upper surfaces or lower surfaces of the IDT electrode 37 and reflectors 39, additional films made of an insulator or metal may be provided as well.

Which of the plurality of chip terminals 19 is the input terminal 19I, output terminal 19O, or reference potential terminal 19G can be judged from the configuration of the SAW filter 33 connected to the plurality of chip terminals 19. Further, usually, in the specification or pamphlet of the SAW chip 7 or SAW device 1, the input terminal and output terminal or reference potential terminal are designated, so identification is possible based on this.

(Conductors of Dummy Chip)

As explained above, the dummy chip 9 has a plurality of (four in the example shown) dummy terminals 27. In the present embodiment, the dummy chip 9 does not have any conductors other than the dummy terminals 27. Accordingly, the dummy chip 9 does not form any electronic component such as an active component or passive component. From another viewpoint, in the dummy chip 9, the dummy terminals 27 are electrically connected through the bumps 16 with the mounting pads 15 on the mounting substrate 5. However, the dummy terminals 27 configures an open end when electrically viewed from the mounting substrate 5.

The plurality of dummy terminals 27 are for example configured by layered conductors which are superposed on the major surface 29a of the dummy substrate 29 on the negative side along the D3 axis. Further, the plurality of dummy terminals 27 are for example arranged along the outer edges of the major surface 29a. The material, planar shapes, and dimensions of the plurality of dummy terminals 27 may be the same as the material, planar shapes, and dimensions of the plurality of chip terminals 19 in the SAW chip 7 or may be different. Note that, when the two are the same, for example, it is easy to make the heights of the bumps 16 equal between the SAW chip 7 and the dummy chip 9.

(Conduction between SAW Chip and Dummy Chip)

Among the plurality of dummy terminals 27 (27A, 27B, 27C, and 27D), for example, at least one of them is made conductive (electrically connected) with any of the chip terminals 19 through the mounting substrate 5 (its conductor). In the example shown, the dummy terminal 27A and the input terminal 19I are made conductive with each other through the wiring 17C. In general, a conductor is higher in heat conductivity compared with an insulator. Accordingly, from another viewpoint, a thermal route is formed by the mounting substrate 5 between the dummy terminal 27 and the chip terminal 19.

As explained above, the dummy chip 9 does not configure an electronic component, but configures an open end when viewed from the mounting substrate 5. Accordingly, the conduction between the SAW chip 7 and the dummy chip 9 basically does not exert an influence upon the characteristics of the SAW chip 7 from a pure electrical viewpoint. Note that, so far as the dummy terminals 27 are conductors, strictly speaking, the dummy chip 9 exhibits a certain mode of operation from an electrical viewpoint. However, the dummy chip 9 is configured so that the mode of operation becomes extremely small in comparison with the characteristics demanded by the SAW chip 7.

The wiring 17C making the SAW chip 7 and the dummy chip 9 conductive is one of the already explained plurality of wirings 17 and is for example configured by a layered conductor superposed on the base body 13 in the mounting substrate 5 as shown in FIG. 2. The shape, the position on the base body 13, and various dimensions of the wiring 17C may be suitably set. In the example shown, the dummy terminal 27A and the input terminal 19I which are made conductive with each other are combined so that the distance between the dummy terminal 27 and the chip terminal 19 becomes the shortest among the plurality of dummy terminals 27 and the plurality of chip terminals 19. Further, the dummy terminal 27A and the input terminal 19I are for example adjacent to each other in the arrangement direction (D1 axis direction) of the SAW chip 7 and the dummy chip 9. Further, the wiring 17C for example linearly extends between the dummy terminal 27A and the input terminal 19I.

(Method for Manufacturing SAW Device)

A method for manufacturing the SAW device 1, although not particularly shown, is for example as follows. First, a wafer from which many mounting substrates 5 are formed, a plurality of SAW chips 7, and a plurality of dummy chips 9 are prepared. Next, a paste for forming a plurality of bumps 16 is placed on the wafer of the mounting substrates 5, the plurality of SAW chips 7 and plurality of dummy chips 9 are arranged on that, and the components are bonded by reflow. After that, an uncured resin is placed on the wafer of the mounting substrates 5 and that resin is made to cure by heat to thereby form a resin layer forming the resin parts 11. After that, the mounting substrates 5 are diced to thereby obtain SAW devices 1 as pieces. At this time, the resin layer is also diced to form the resin parts 11. However, dicing of the resin layer and dicing of the wafer of the mounting substrates 5 may be sequentially carried out by different blades.

The uncured resin forming the resin parts 11 for example may be placed by a dispenser process or printing process or may be placed by placing a sheet made of resin having a relatively high viscosity. The resin for example may be cured just by heating or may be cured by heating while pressurizing the resin from the upper part by a mold having a flat lower surface.

The vibration space 31 may be suitably formed. For example, by making the viscosity of the resin in the uncured state relatively high or making the pressure of the resin in the uncured state relatively low, invasion of the uncured resin into the spaces between the mounting substrates 5 and the SAW chips 7 may be suppressed to form the vibration spaces 31. Further, preceding the arrangement of the uncured resin, it is also possible to cover a film on the SAW chips 7, suppress invasion of the resin into the spaces between the mounting substrates 5 and the SAW chips 7 by the film, and form the vibration spaces 31.

Note that, the above manufacturing method is one example and may be suitably changed. For example, the SAW chips 7 and the dummy chips 9 may be mounted on already diced mounting substrates 5 and then the resin parts 11 formed. Otherwise, the SAW chips 7 and the dummy chips 9 may mounted, the wafer of the mounting substrates 5 may be diced, then the resin parts 11 may be formed. The resin parts 11 may be formed according to a transfer molding method or the resin part 11 may be formed by a compression molding process dipping the SAW chips 7 and the dummy chips 9 mounted on the mounting substrates 5 into an uncured resin arranged in a recessed part in the upper surface of a lower mold.

As explained above, the SAW device 1 has the mounting substrate 5 having the mounting surface 5a, the SAW chip 7 mounted on the mounting surface 5a, the dummy chip 9 mounted on the mounting surface 5a, and the resin part 11 covering the SAW chip 7 and the dummy chip 9. The dummy chip 9 has the insulating dummy substrate 29 and one or more dummy terminals 27 which are positioned on the surface of the dummy substrate 29 on the mounting surface 5a side and are bonded with the mounting surface 5a. The dummy chip 9 configures an open end (is not an electronic component such as an active element or passive element) when electrically viewed from the mounting substrate 5 side.

Here, the size of the mounting substrate 5 when viewed on a plane is sometimes determined according to the specifications of the manufacturer which purchases the SAW device 1 (customer of the SAW device 1). As a result, when viewed on a plane, sometimes the mounting substrate 5 becomes too large relative to the SAW chip 7. Specifically, sometimes the mounting substrate 5 becomes 2.5 times or more of the area of the SAW chip 7 when viewed on a plane. In this case, for example, sometimes the top surface 1a of the resin part 11 becomes higher above the SAW chip 7 than its periphery, therefore the top surface 1a is no longer flat. The relief shapes are for example caused by the uncured resin being made bulkier by the SAW chip 7 when the uncured resin for forming the resin part 11 is placed on the mounting substrate 5, and this unevenness in height of the top surface of the resin due to this increased bulk is not eliminated by the completion of hardening. Alternatively, for example, the resin on the periphery of the SAW chip 7 is thicker than the resin above the SAW chip 7, therefore the amount of shrinkage of the former resin after hardening is relatively larger than that of the latter resin. The difference in the amounts of shrinkage cause the formation of relief shapes.

On the other hand, in the present embodiment, the dummy chip 9 is mounted on the mounting surface 5a together with the SAW chip 7. Therefore, compared with a case where no dummy chip 9 is provided, for example, the uncured resin is raised in bulk and/or the thickness of the resin is reduced, so the amount of shrinkage of the resin is reduced. That is, the probability of formation of relief shapes at the top surface 1a of the resin part 11 is reduced. From another viewpoint, when employing a method of formation of the resin part 11 giving a flat top surface 1a, setting of the conditions in the method of formation is facilitated. Further, the degree of freedom of the conditions is improved. As a result of the top surface 1a becoming flat, for example, when the top surface 1a of the SAW device 1 is sucked to picked up the SAW device 1, pickup is facilitated. Further, for example, when holding the SAW device 1 by a special jig and measuring the characteristics of the SAW device 1, the hold becomes stable, therefore measurement error is reduced.

In the present embodiment, the dummy chip 9 has only one or more dummy terminals 27 as conductors.

Accordingly, this means for example the dummy chip 9 has just the minimum configuration for mounting the device on the mounting substrate 5. As a result, for example, the cost can be reduced. Further, for example, the parasitic capacitance due to the dummy chip 9 can be minimized. As a result, a possibility of lowering of the characteristics of the SAW device 1 due to the dummy chip 9 can be reduced.

In the present embodiment, the SAW chip 7 and at least one among the one or more dummy terminals 27 are made conductive through the mounting substrate 5.

Accordingly, heat in the SAW chip 7 can be made to escape to the dummy chip 9. As a result, the temperature of the SAW chip 7 becomes stable and in turn the characteristics of the SAW chip 7 become stable. That is, the dummy chip 9 not only contributes to improvement of function (stabilization of shape) of the SAW device 1 in terms of the structure as described above, but also contributes to improvement of function of the SAW device 1 thermally.

In the present embodiment, the SAW chip 7 has the input terminal 19I to which a signal is input, the output terminal 19O outputting a signal, and the reference potential terminal 19G given the reference potential. The input terminal 19I is made conductive with one among one or more dummy terminals 27 through the mounting substrate 5.

In general, compared with the output terminal 19O and reference potential terminal 19G, the input terminal 19I is supplied with a relatively large electrical power and more relatively easily generates heat. By making such an input terminal 19I conductive with the dummy chip 9, the heat in the SAW chip 7 can be effectively made escape to the dummy chip 9.

In the present embodiment, the material of the dummy substrate 29 is lower in thermal expansion coefficient than the material of the resin part 11.

Accordingly, for example, compared with a case where no dummy chip 9 is provided, stress which is applied from the dummy chip 9 side to the SAW chip 7 due to the thermal expansion of the resin part 11 can be reduced. As a result, for example, the possibility that unintended stress is given to the piezoelectric substrate 23 and the propagation characteristic of the SAW is changed and the characteristics of the SAW device 1 fall is reduced. In this way, the dummy chip 9 not only contributes to the improvement of function of the SAW device 1 structurally and thermally, but also contributes to the improvement of function of the SAW device 1 dynamically.

In the present embodiment, the dummy chip 9 is thicker than the SAW chip 7.

Accordingly, for example, the effect of reducing the stress which is applied from the dummy chip 9 side to the SAW chip 7 is more reliably exhibited. Further, for example, the volume of the resin part 11 which is replaced by the volume of the dummy chip 9 becomes relatively large, therefore the thermal expansion of the SAW device 1 as a whole is reduced.

In the present embodiment, the SAW chip 7 includes the piezoelectric substrate 23 through which the SAW propagates in a predetermined direction of propagation (D1 axis direction). The dummy chip 9 overlaps the SAW chip 7 when viewed in the direction of propagation.

Among deformations of the piezoelectric substrate 23, the deformation in the direction of propagation of the SAW most easily exerts an influence upon the characteristics of the SAW chip 7. Accordingly, for example, by positioning the dummy chip 9 having a lower thermal expansion coefficient than the resin part 11 in the direction of propagation of the SAW to reduce the stress to the lateral sides, the effect of reduction of lowering of the specification can be more effectively obtained.

In the present embodiment, the SAW chip 7 has the piezoelectric substrate 23, the support substrate 25 which is bonded to the piezoelectric substrate 23, which is lower in thermal expansion coefficient than the piezoelectric substrate 23, and which is thicker than the piezoelectric substrate 23, and the IDT electrode 37 positioned on the major surface 23a of the piezoelectric substrate 23 on the opposite side to the support substrate 25.

Accordingly, for example, the SAW chip 7 can be given a temperature compensation effect by the support substrate 25. This temperature compensation effect utilizes the difference of thermal expansion between the piezoelectric substrate 23 and the support substrate 25 (from another viewpoint, the thermal stress generated in the piezoelectric substrate 23). Accordingly, for example, the possibility of application of an unintended stress from the resin part 11 to the SAW chip 7 is reduced by the dummy chip 9, so the temperature compensation effect by the support substrate 25 is stabilized.

The SAW chip 7 is liable to warp inward at the support substrate 25 side due to the difference of thermal expansion between the piezoelectric substrate 23 and the support substrate 25 and in turn to fall in the electrical characteristics of the SAW chip 7. Further, portions in the resin part 11 which are positioned on the lateral sides of the SAW chip 7 are liable to give stress toward the lateral sides to the SAW chip 7 due to thermal expansion and aggravate the warping. However, if the dummy chip 9 with the lower thermal expansion coefficient than the material of the resin part 11 is mounted alongside the SAW chip 7, aggravation of the warping is suppressed.

Further, where the SAW chip 7 is mounted with the piezoelectric substrate 23 side made to face the mounting surface 5a side, the portion in the resin part 11 which is positioned above the support substrate 25 acts to suppress the warping described above. Accordingly, when the dummy chip 9 is thicker than the SAW chip 7 (higher in height from the mounting surface 5a), the thickness of the resin part 11 can be secured above the SAW chip 7 while the possibility of formation of a recessed part in the top surface 1a of the resin part 11 at the position of the dummy chip 9 can be reduced. That is, the warping described above is suppressed to improve the characteristics while stability due to the top surface 1a being flat can be obtained.

Further, the SAW device 1 in the above embodiment, from another viewpoint, has the mounting substrate 5 having the mounting surface 5a, a first chip (SAW chip 7) mounted on the mounting surface 5a, a second chip (dummy chip 9) mounted on the mounting surface 5a, and the resin part 11 covering the SAW chip 7 and dummy chip 9. The SAW chip 7 has the piezoelectric substrate 23, the support substrate 25 which is bonded to the piezoelectric substrate 23, which has a lower thermal expansion coefficient than the piezoelectric substrate 23, and which is thicker than the piezoelectric substrate 23, and the IDT electrode 37 positioned on the major surface 23a of the piezoelectric substrate 23 on the opposite side to the support substrate 25. Further, the SAW chip 7 is mounted on the mounting surface 5a with the IDT electrode 37 side (major surface side) made to face the mounting surface 5a. The dummy chip 9 has the piezoelectric substrate (dummy substrate 29 made of a piezoelectric body) which is thicker than the total thickness of the piezoelectric substrate 23 and support substrate 25. The top surface 1a of the resin part 11 on the opposite side to the mounting surface 5a is flat over the top of the SAW chip 7 and the top of the dummy chip 9.

Accordingly, as explained above, although the SAW chip 7 is liable to warp inward at the top surface 1a side, the thickness of the resin part 11 can be secured above the SAW chip 7 and warping can be suppressed. Further, the possibility of formation of a recessed part in the top surface 1a of the resin part 11 at the position of the dummy chip 9 can be reduced.

Second Embodiment

Figure 4:
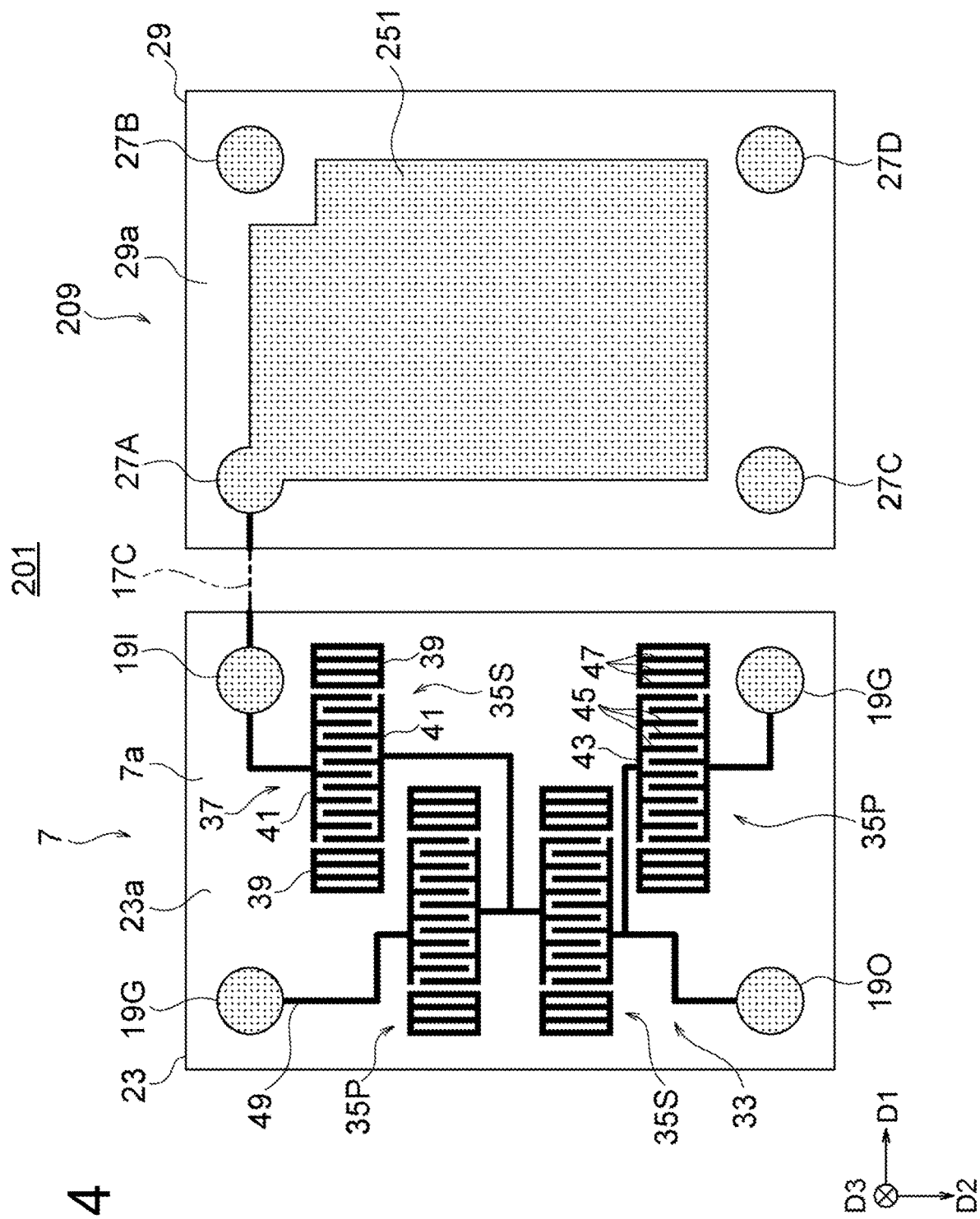
FIG. 4 is a schematic plan view showing the configuration of a principal part of a SAW device according to a second embodiment.

FIG. 4 is a schematic plan view showing the configuration of the principal part of a SAW device 201 according to a second embodiment and corresponds to FIG. 3 of the first embodiment.

The SAW device 201 differs from the SAW device 1 in the first embodiment only in the point that a solid pattern 251 is provided on the dummy chip 209.

The solid pattern 251 is configured by a layered conductor superposed on the major surface 29a of the dummy substrate 29 on the negative side along the D3 axis. The material and thickness of the solid pattern 251 may be the same as or different from the material and thicknesses of the plurality of dummy terminals 27. For example, they are the same. Further, the plurality of dummy terminals 27 may have layers which are made of the same materials and have the same thicknesses as those of the solid pattern 251 and other layers made of other materials which are positioned on the former layers as well. The material and thickness of the solid pattern 251 may be the same as or may be different from the material and thickness of the IDT electrode 37.

The planar shape of the solid pattern 251 may be suitably set. In the example shown, it is made schematically rectangular. Other than this, although not particularly shown, the solid pattern 251 may be made circular, elliptical, or polygonal other than rectangular and/or may be shaped so as to configure a convex shape (convex set) referred to in mathematics. The solid pattern 251 may be larger than the other conductor patterns arranged on the same surface as well. Further, it may occupy 40% or more of the area of the major surface 29a of the dummy chip 209.

Further, in the example shown, the solid pattern 251 is cut away at one corner portion of the rectangle in order to be separated from the dummy terminal 27B. In this way, the entirety of the solid pattern 251 need not be shaped as described above (rectangular or the like). For example, the solid pattern 251 may form the shape as described above at the time when the area is increased or decreased by 20% or less or 10% or less of the area of the solid pattern 251.

The solid pattern 251 is for example connected with at least one of the plurality of dummy terminals 27. In the example shown, the solid pattern 251 is connected with the dummy terminal 27A. This dummy terminal 27A, for example, in the same way as the first embodiment, is made conductive with the input terminal 19I in the SAW chip 7 by the wiring 17C. Further, in the example shown, the solid pattern 251 is not connected with the other dummy terminal 27A.

As described above, in the present embodiment as well, the SAW device 201 has the mounting substrate 5, SAW chip 7, dummy chip 209, and resin part 11. Further, the dummy chip 9 has the dummy terminals 27 and configures an open end when electrically viewed from the mounting substrate 5 side. Accordingly, the same effects as those by the first embodiment are exhibited. For example, it is easy to make the top surface of the resin part 11 flat.

Further, in the present embodiment, the dummy chip 209 has the solid pattern 251 which is connected to at least one among one or more dummy terminals 27 (27A in the present embodiment).

Accordingly, in the dummy chip 209, the heat transferred from the mounting substrate 5 to the dummy terminal 27A can be efficiently transferred to a broad area. In turn, it becomes easy to make the heat in the SAW chip 7 escape, therefore the heat resistance and electrical resistance of the SAW device 201 as a whole can be improved.

Third Embodiment

Figure 5:
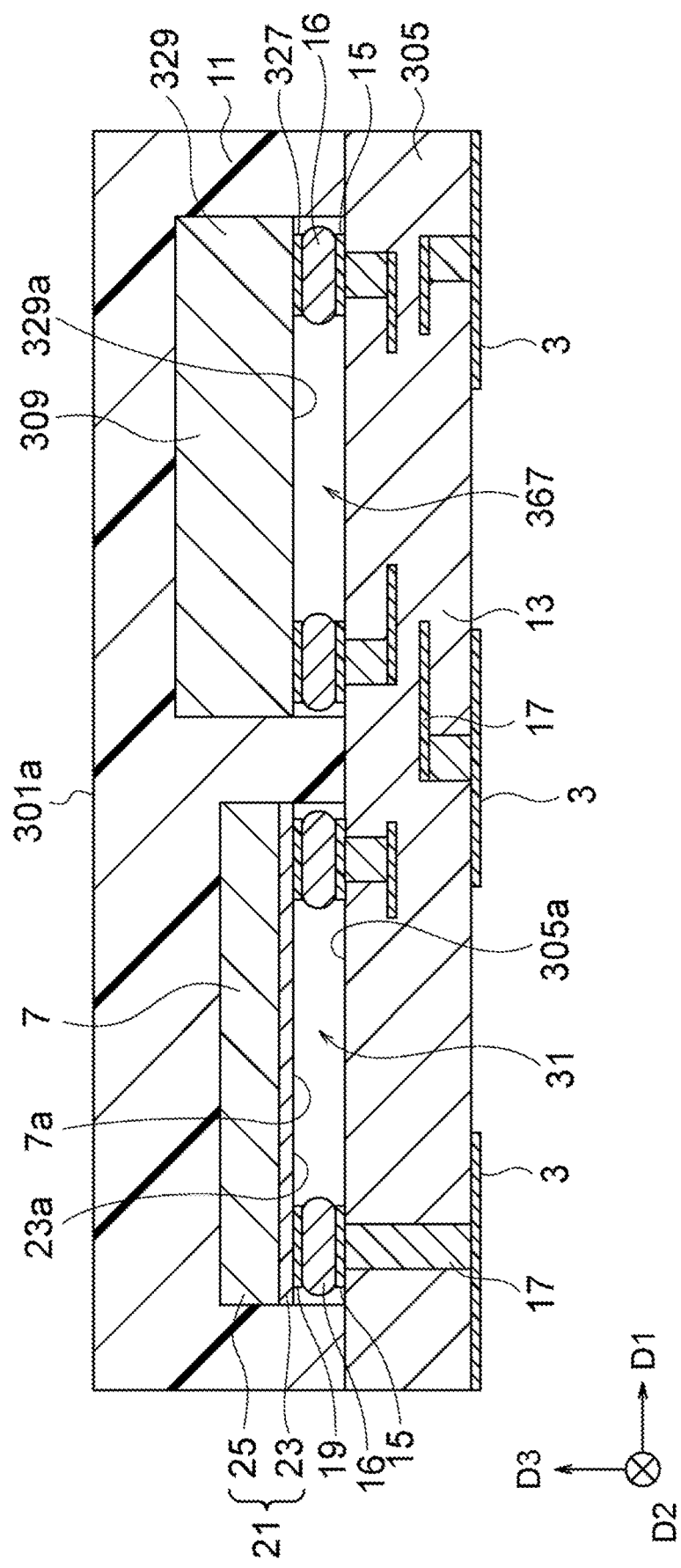
FIG. 5 is a schematic plan view showing the configuration of a principal part of a SAW device according to a third embodiment.
Figure 6:
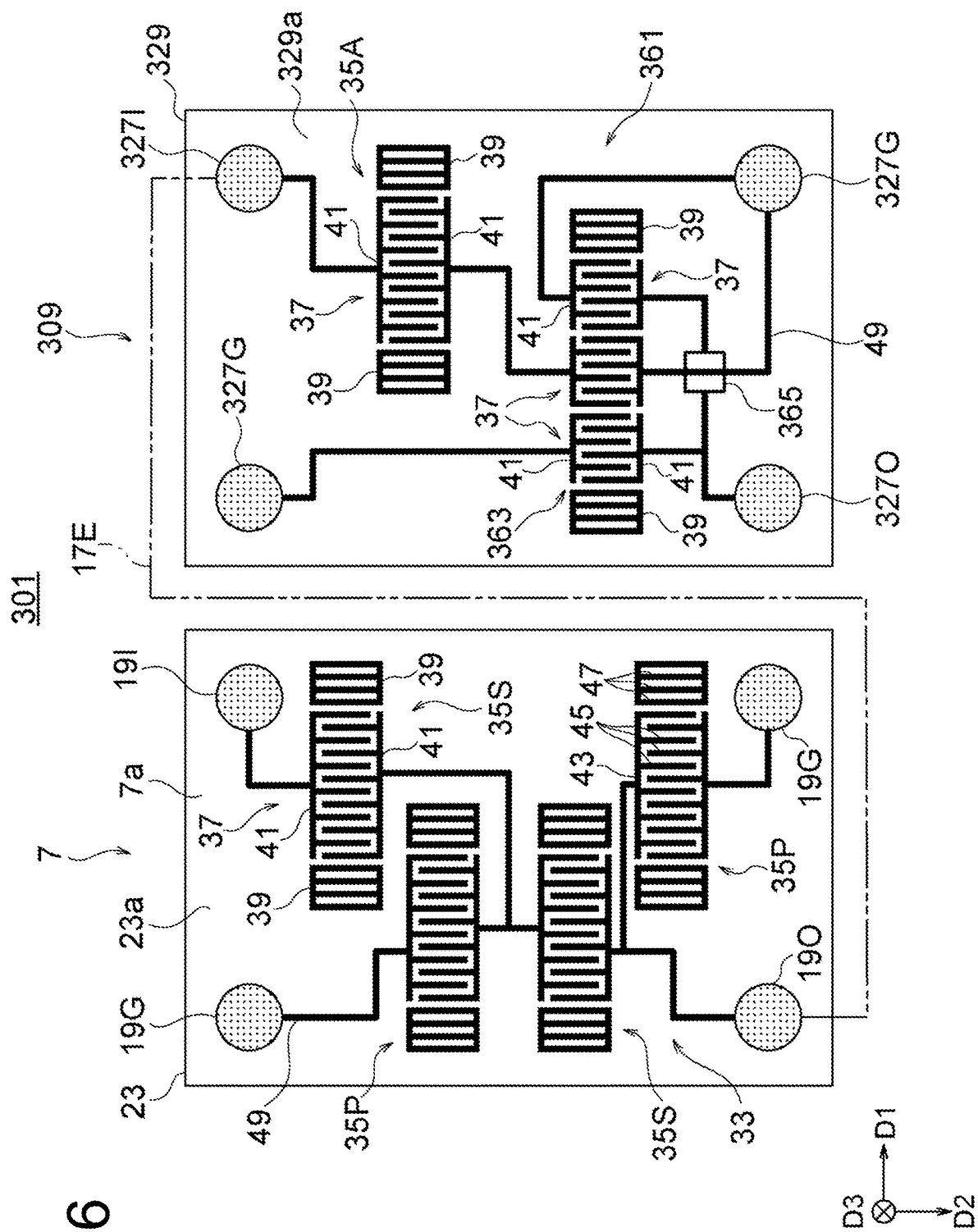
FIG. 6 is a schematic plan view showing the configuration of the principal part of the SAW device in FIG. 5.

FIG. 5 is a schematic cross-sectional view showing the configuration of the principal part of a SAW device 301 according to a third embodiment and corresponds to FIG. 2 of the first embodiment. FIG. 6 is a schematic plan view showing the configuration of the principal part of the SAW device 301 and corresponds to FIG. 3 of the first embodiment.

The SAW device 301 mainly differs from the SAW device 1 in the first embodiment in the point that provision is made of a SAW chip 309 in place of the dummy chip 9.

(SAW Chip)

The SAW chip 309 is basically the same as the SAW chip 7 in the first embodiment, therefore the explanation for the SAW chip 7 may be used as the explanation for the SAW chip 309. Naturally, specific parts may be different from those in the SAW chip 7 as well. In the following explanation, the points of difference of the SAW chip 309 from the SAW chip 7 in the example shown will be focused on in the explanation.

The substrate of the SAW chip 309 is not a bonded substrate, but is configured mainly by a piezoelectric substrate 329. Note that, the explanation for the piezoelectric substrate 23 in the first embodiment may be used as the explanation for the piezoelectric substrate 329 excluding the thickness. The material of the piezoelectric substrate 329 (cut angle may be or may not be taken into account) may be the same as or may be different from the material of the piezoelectric substrate 23 which is actually mounted on the mounting substrate 305 together.

The SAW chip 309, for example, in the same way as the SAW chip 7, includes at least one input terminal 327I to which a signal is input, at least one output terminal 327O outputting a signal, and at least one reference potential terminal 327G given the reference potential. These chip terminals 327, for convenience, are assigned notations different from those of the chip terminals 19 in the SAW chip 7. However, the explanation of the chip terminals 19 in the first embodiment may be regarded as the explanation of the chip terminals 327.

The SAW chip 309, for example, in the same way as the SAW chip 7, has a SAW filter 361 which filters the signal input to the input terminal 327I and outputs the result to the output terminal 327O. However, in the example shown, the SAW filter 361 is configured including a so-called multi-mode type SAW resonator filter 363 (hereinafter, simply referred to as the "SAW filter 363") and a resonator 35A which is connected in series to this SAW filter 363.

The SAW filter 363 is for example configured including, on the major surface 329a of the piezoelectric substrate 329, a plurality of (three in the example shown) IDT electrodes 37 which are arranged in the direction of propagation of the SAW and a pair of reflectors 39 which are arranged on the two sides of them. Note that, in the present disclosure, the multiplex mode includes a double mode. The resonator 35A is a 1-port SAW resonator explained in the first embodiment.

On the major surface 329a of the piezoelectric substrate 329, the plurality of IDT electrodes 37 and the plurality of chip terminals 327 are for example connected by the plurality of wirings 49 on the major surface 329a in the same way as the first embodiment. Note that, in the example shown, the wiring 49 connecting the SAW filter 363 and the output terminal 3270 and the wiring 49 connecting the SAW filter 363 and the reference potential terminal 327G three-dimensionally intersect through an insulator 365.

(Mounting Substrate and Resin Part)

The SAW chip 309, for example, in the same way as the SAW chip 7, is mounted on the mounting surface 305a of the mounting substrate 305 by the bumps 16 so that the major surface 329a having the IDT electrodes 37 formed thereon is made to face the mounting surface 305a. Further, in the same way as the SAW chip 7, the space between the major surface 329a and the mounting surface 305a is made a vibration space 367 which is not filled with the resin of the resin part 11.

The mounting substrate 305 is the same as the mounting substrate 5 in the first embodiment, therefore the explanation of the mounting substrate 5 may be regarded as the explanation of the mounting substrate 305. However, along with by the electronic component which is mounted being made the SAW chip 309 in place of the dummy chip 9, for example, the specific numbers and arrangement etc. of the plurality of mounting pads 15, plurality of external terminals 3, and plurality of wirings 17 may be suitably changed.

The plurality of external terminals 3 may be separately provided between the SAW chip 7 and the SAW chip 309 or parts may be shared by the two chips. Explaining the latter in another way, the two chips may be electrically connected with each other through the mounting substrate 305. For example, the external terminal 3 given the reference potential may be shared by the SAW chip 7 and the SAW chip 309.

Further, for example, in a case where the SAW chip 7 is made a transmission filter in a multiplexer and the SAW chip 309 is made a receiving filter in the multiplexer (case where the SAW device 301 configures a multiplexer), the external terminal 3 connected to the antenna may be shared by the two chips. More specifically, as indicated by a two-dotted chain line in FIG. 6 (wiring 17E), the output terminal 19O in the SAW chip 7 and the input terminal 3271 in the SAW chip 309 may share the external terminal 3 (may be connected to each other). Note that, the SAW chip 7 may also be made the receiving filter and the SAW chip 309 may be made the transmission filter.

(Relative Relationships of Two SAW Chips)

The explanation of the relative position, distance, and thickness etc. of the dummy chip 9 relative to the SAW chip 7 in the first embodiment may be regarded as the explanation of the SAW chip 309. For example, the SAW chip 309 may be made thicker than the SAW chip 7.

As described above, in the present embodiment as well, the SAW device 301 has the mounting substrate 305 having the mounting surface 305a, first chip (SAW chip 7) mounted on the mounting surface 305a, second chip (SAW chip 309) mounted on the mounting surface 305a, and the resin part 11 covering the two chips. The SAW chip 7 has the piezoelectric substrate 23, the support substrate 25 which is bonded to the piezoelectric substrate 23, which has a lower thermal expansion coefficient than the piezoelectric substrate 23, and which is thicker than the piezoelectric substrate 23, and the IDT electrodes 37 positioned on the major surface 23a of the piezoelectric substrate 23 on the opposite side to the support substrate 25. Further, the SAW chip 7 is mounted on the mounting surface 205a with the IDT electrode 37 side made to face the mounting surface 205a. The SAW chip 309 has the piezoelectric substrate 329 which is thicker than the total thickness of the piezoelectric substrate 23 and support substrate 25 (from another viewpoint, the height of the SAW chip 309 from the mounting surface 305a is higher than the SAW chip 7 from the mounting surface 305a). The top surface 301a of the resin part 11 on the opposite side to the mounting surface 305a is flat over the top of the SAW chip 7 and the top of the SAW chip 309.

Accordingly, for example, the same effects as those by the first embodiment are exhibited. Specifically, for example, the SAW chip 7 is liable to warp to the inside of the top surface 301a side, but this chip is relatively low compared with the SAW chip 309, therefore the thickness of the resin part 11 can be secured above the SAW chip 7 and warping can be reduced.

MODIFICATIONS

First Modification

Figure 7A:
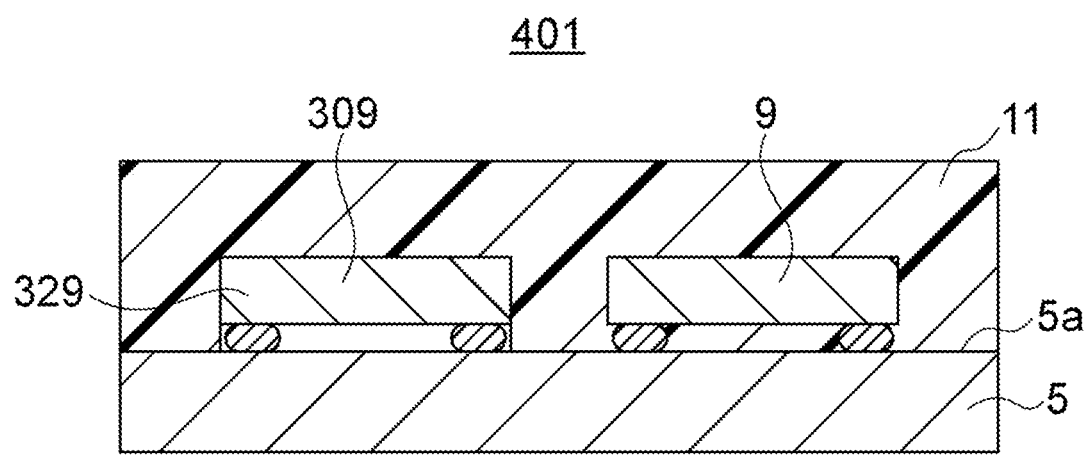
FIG. 7A is a schematic cross-sectional view showing the configuration of a principal part of a SAW device according to a first modification.

FIG. 7A is a schematic cross-sectional view showing the configuration of the principal part of a SAW device 401 according to a first modification.

In the first embodiment, the case where the SAW chip 7 mounted together with the dummy chip 9 had the bonded substrate (chip substrate 21) was explained. However, the SAW chip mounted together with the dummy chip, in the same way as the SAW chip 309 in the third embodiment, may have a substrate which is not a bonded substrate (one mainly configured by a piezoelectric substrate 329). In FIG. 7A, the notation of the SAW chip 309 is shown in place of the SAW chip 7, and a case where both of the SAW chip 309 and the dummy chip 9 are mounted on the mounting substrate 5 together is illustrated. Note that, the dummy chip 9 was taken as an example. However, the same is true for the dummy chip 209 in the second embodiment.

As referred to also in the explanation of the embodiments, the SAW chip 7 (309) and the dummy chip 9 (209) may have the same thicknesses as each other (from another viewpoint, the heights from the mounting surface 5a may be the same). FIG. 7A also illustrates this point.

Second Modification

Figure 7B:
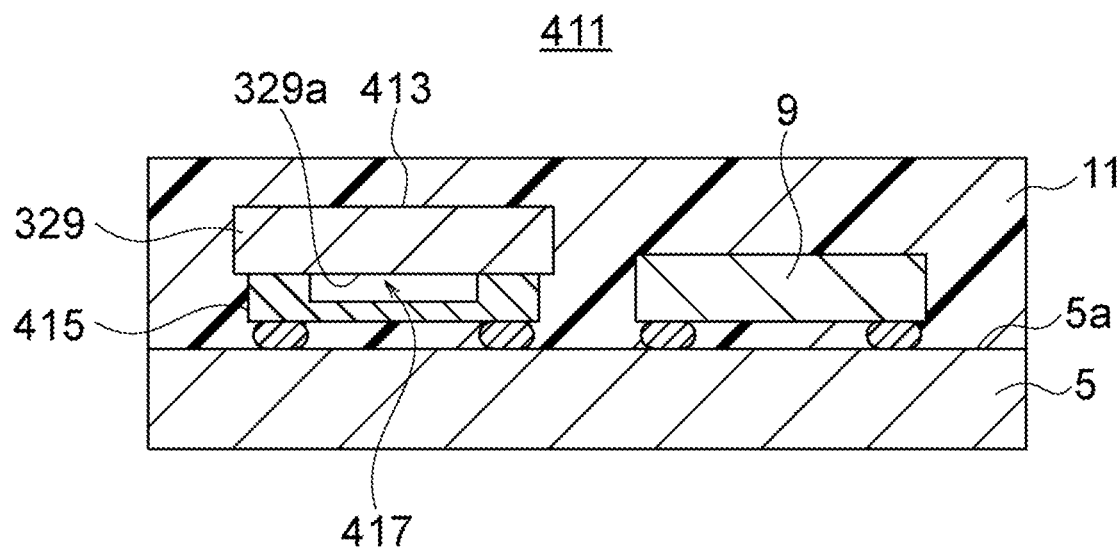
FIG. 7B is a schematic cross-sectional view showing the configuration of a principal part of a SAW device according to a second modification.

FIG. 7B is a schematic cross-sectional view showing the configuration of the principal part of a SAW device 411 according to a second modification.

In the first embodiment, as the SAW chip 7, one which was not packaged was illustrated. However, the SAW chip may be a packaged one as well.

In the example shown, a SAW chip 413 has the piezoelectric substrate 329 and a cover 415 which covers the major surface 329a of the piezoelectric substrate 329 from the tops of the IDT electrodes 37 (see FIG. 6 etc.). The cover 415 is shaped so as to configure a vibration space 417 above the IDT electrodes 37. To the chip terminals 327 (see FIG. 6), not shown pads which are formed on the surface of the cover 415 on the mounting surface 5a side are connected through not shown conductors penetrating through the cover 415. By bonding these pads with the mounting pads 15 (see FIG. 2) on the mounting substrate 5, the SAW chip 413 is mounted on the mounting surface 5a.

Note that, as the substrate in the SAW chip 413, FIG. 7B shows the configuration formed by the piezoelectric substrate 329 as the main part in the same way as the SAW chip 309 in the third embodiment. However, the substrate in the SAW chip 413 may be a bonded substrate in the same way as the SAW chip 7 as well. Further, in FIG. 7B, the dummy chip 9 is shown. However, the dummy chip 9 may be replaced with the dummy chip 209 or other SAW chip.

As referred to in the explanation of the embodiments as well, the dummy chip 9 (209) may be thinner than the SAW chip 7 (309) as well (from another viewpoint, the height of the dummy chip from the mounting surface 5a may be lower than that of the SAW chip as well). In FIG. 7B, this point is also illustrated.

Third to Fifth Modifications

Figure 8A:
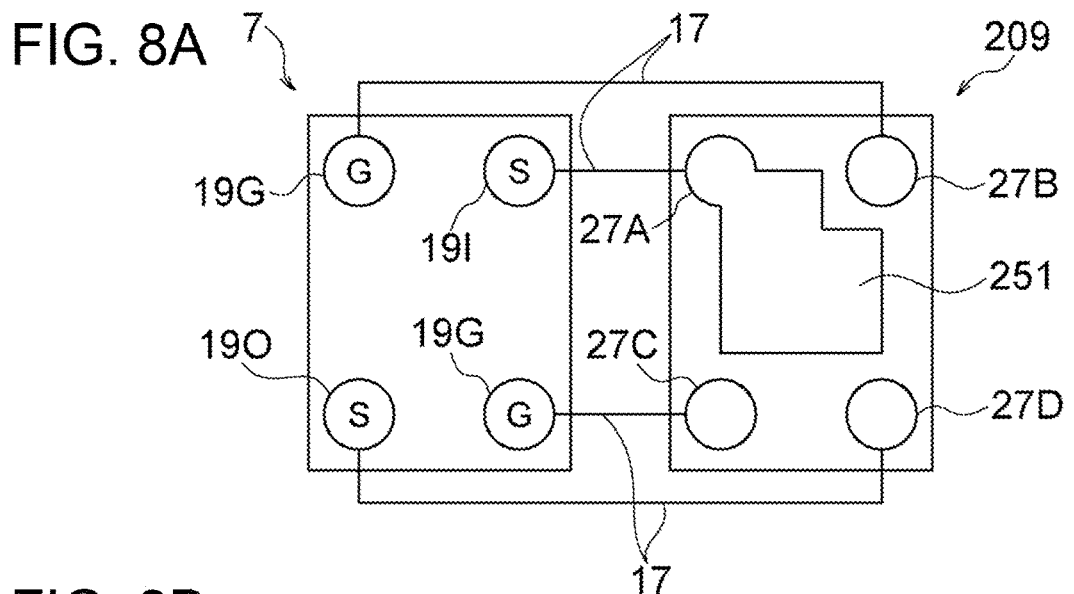
FIG. 8A, FIG. 8B, and FIG. 8C are schematic views for explaining SAW devices according to third, fourth, and fifth modifications.
Figure 8B:
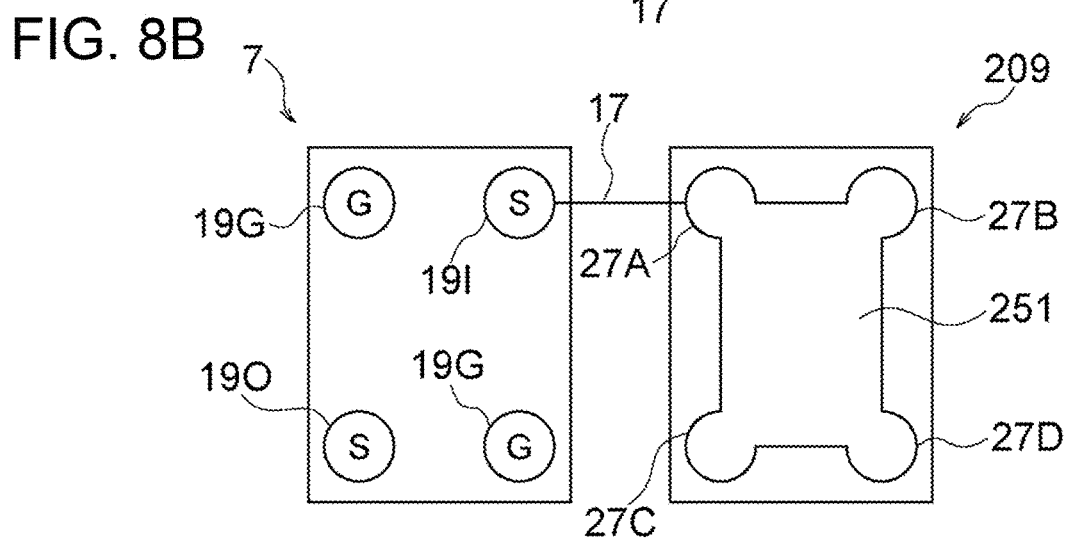
Figure 8C:
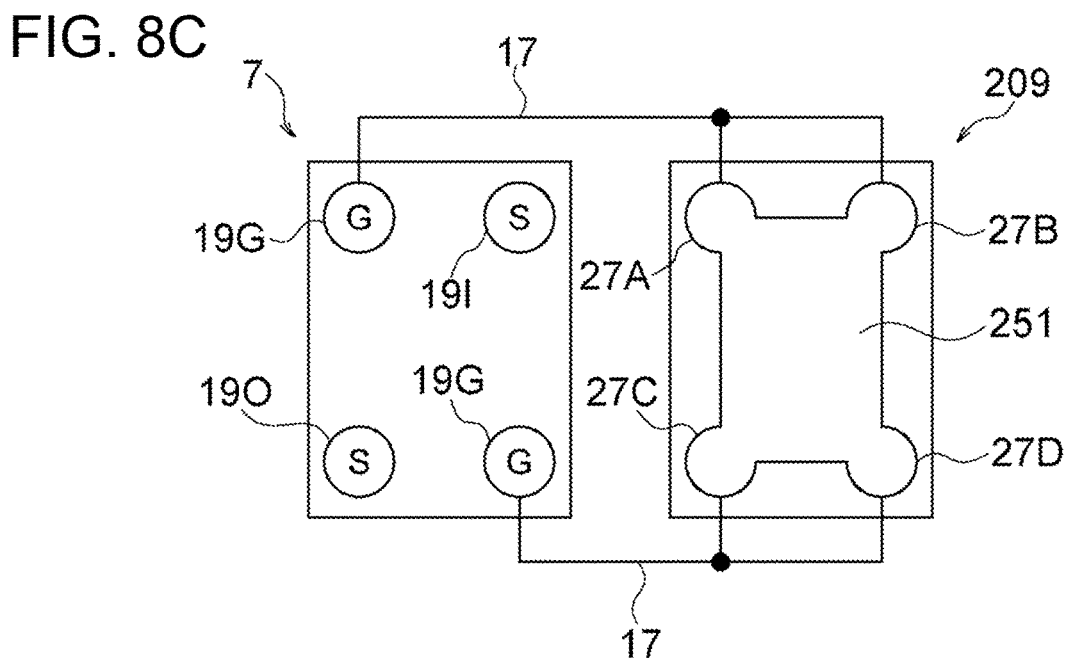

FIG. 8A to FIG. 8C are schematic views showing modifications (third to fifth modifications) of connections of the dummy terminals 27 and/or solid pattern 251 with respect to the chip terminals 19.

In the first embodiment, only the connection of the dummy terminal 27A through the wiring 17 on the mounting substrate 5 with the input terminal 19I was explained. However, a suitable number of terminals among the plurality of dummy terminals 27 may be connected through the wirings 17 with the chip terminals 19 or may be connected with respect to any chip terminal 19.

For example, the dummy terminals 27, as illustrated in FIG. 8A or FIG. 8C, may be all connected through the wirings 17 to the chip terminals 19. Otherwise, only the dummy terminal 27A may be connected through the wiring 17 to the chip terminal 19 as illustrated in FIG. 8B. The two or more dummy terminals 27 may be connected through the wirings 17 to the same chip terminal 19 as well as illustrated in FIG. 8C.

Further, the dummy terminals 27, as illustrated in FIG. 8A, may be connected not only with the input terminal 19I, but also with the output terminal 19O through the wirings 17 or may be connected through the wiring 17 to the reference potential terminal 19G as illustrated in FIG. 8A or FIG. 8C. As will be understood from the dummy terminals 27B to 27D in a case where removal of the solid pattern 251 from FIG. 8B is assumed, part or all of the dummy terminals 27 may be made electrically floating in state as well.

The solid pattern 251 may be connected not with the dummy terminal 27 which is connected through the wiring 17 with the input terminal 19I, but the dummy terminal 27 which is connected through the wiring 17 with the output terminal 19O (not shown). Otherwise, it may be connected with the dummy terminals 27 connected to the reference potential terminals 19G through the wirings 17 as illustrated in FIG. 8C or may be connected to the dummy terminals 27 (27B to 27D) in an electrically floating state in the connection of the wirings 17 as illustrated in FIG. 8B.

The solid pattern 251 may be connected to not only one dummy terminal 27, but also two or more dummy terminals 27 as illustrated in FIG. 8B or FIG. 8C. However, in this case, the two or more dummy terminals 27 which are connected with each other by the dummy terminals 27 may be made ones given the same potential in the connection of the wirings 17 as illustrated in FIG. 8C or made a combination of the dummy terminal 27 given the potential in the connection of the wiring 17 and the dummy terminals 27 in electrically floating state in the connection of the wiring 17 as illustrated in FIG. 8B. Note that, in FIG. 8C, the solid pattern 251 is connected with the two or more dummy terminals 27 given the reference potentials through the wirings 17. However, it may be connected with the two or more dummy terminals 27 given the potential of the input signal or output signal through the wirings 17 as well.

Example of Utilization

Figure 9:
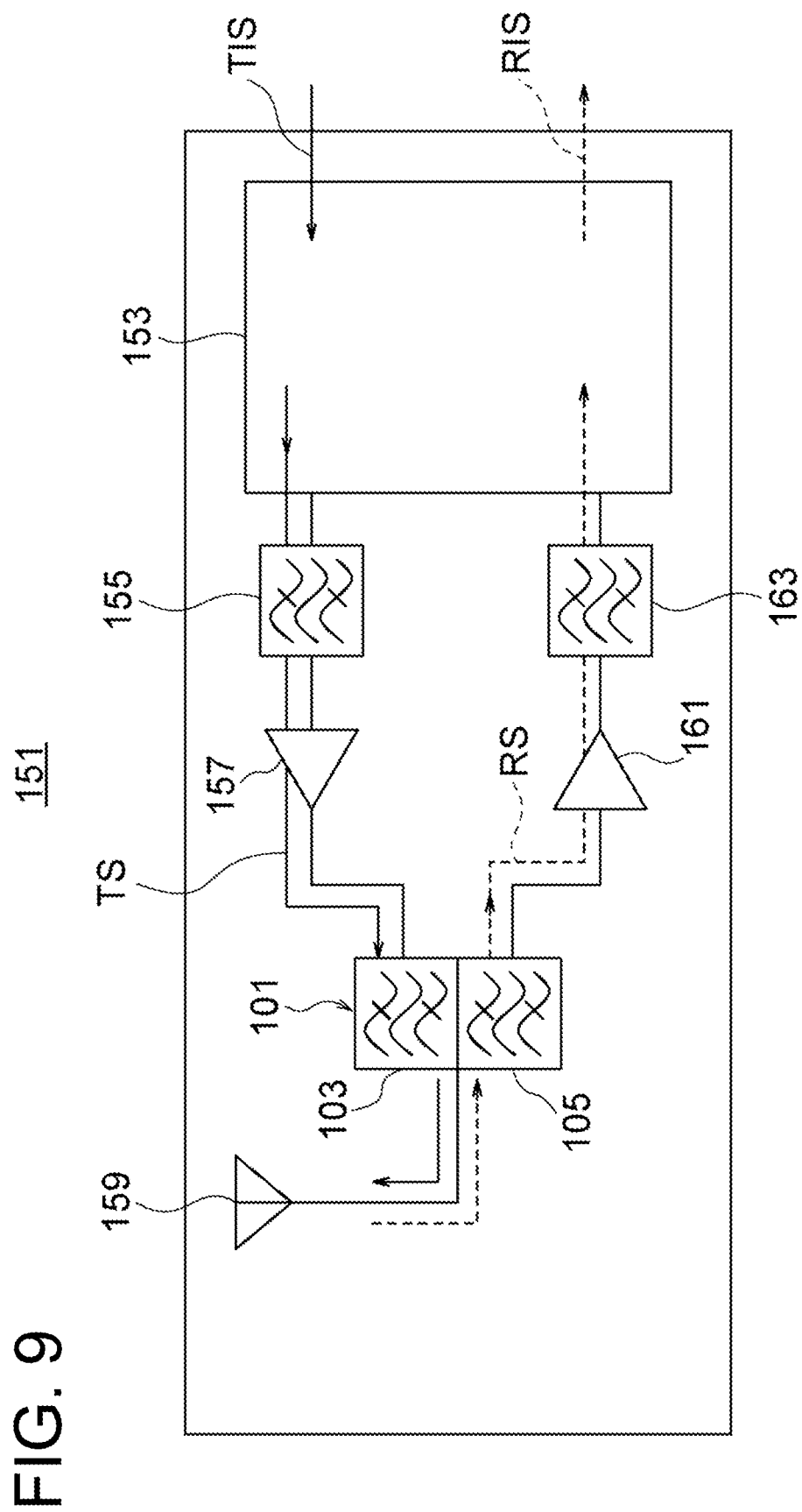
FIG. 9 is a block diagram showing the configuration of a principal part of a communication apparatus as an example of utilization of the SAW device.

FIG. 9 is a block diagram showing the principal part of a communication apparatus 151 as an example of utilization of the SAW device 1.

The communication apparatus 151 performs wireless communication utilizing radio waves. This communication apparatus 151 for example has a multiplexer 101 having a transmission filter 103 and receiving filter 105. This transmission filter 103 or receiving filter 105 or multiplexer 101 is for example configured by the SAW device 1 in the first embodiment. Note that, in place of the SAW device 1 in the first embodiment, use may be made of a SAW device according to the other embodiments or modifications as well.

In the communication apparatus 151, a transmission information signal (TIS) including information to be transmitted is modulated and raised in frequency (converted to a high frequency signal having a carrier frequency) by the RF-IC (radio frequency integrated circuit) 153 to become the transmission signal TS. The transmission signal TS is stripped of unwanted components other than the transmission-use passing band by a band pass filter 155, is amplified by an amplifier 157, and is input to the transmission filter 103 in the multiplexer 101. Further, the transmission filter 103 strips the unwanted components other than the transmission-use passing band from the input transmission signal TS and outputs the transmission signal TS after stripping to an antenna 159. The antenna 159 converts the input electrical signal (transmission signal TS) to a wireless signal (radio wave) and transmits the result.

Further, in the communication apparatus 151, the wireless signal (radio wave) received by the antenna 159 is converted to an electrical signal (reception signal RS) by the antenna 159 and is input to the receiving filter 105 in the multiplexer 101. The receiving filter 105 strips unwanted components other than the reception-use passing band from the input reception signal RS and outputs the result to an amplifier 161. The output reception signal RS is amplified by the amplifier 161 and is stripped of unwanted components other than the reception-use passing band by a band pass filter 163. Further, the reception signal RS is boosted down in frequency and demodulated by the RF-IC 153 to become the reception information signal RIS.

Note that, the transmission information signal TIS and reception information signal RIS may be low frequency signals (baseband signals) containing suitable information. For example, they are analog audio signals or digital audio signals. The passing band of the wireless signal may be suitably set. In the present embodiment, a passing band of a relatively high frequency (for example 5 GHz or more) is possible too. The modulation scheme may be phase modulation, amplitude modulation, frequency modulation, or a combination of any two or more among them. As the circuit system, FIG. 9 illustrated a direct conversion system. However, a suitable system other than that may be employed. For example, it may be a double superheterodyne system as well. Further, FIG. 9 schematically shows only the principal part. A low pass filter or isolator etc. may be added to suitable positions. Further, the positions of the amplifier etc. may be changed as well.

Note that, in the above embodiments, each of the SAW devices 1, 201, 301, 401, and 411 is one example of the acoustic wave device. Each of the SAW chips 7, 309, and 413 is one example of the acoustic wave chip. The SAW chip 7 is one example of the first chip. The piezoelectric substrate 23 in the SAW chip 7 is one example of the first piezoelectric substrate. The IDT electrode 37 in the SAW chip 7 is one example of the first IDT electrode. The dummy chip 9 in the SAW device 1, the dummy chip 209 in the SAW device 201, and the SAW chip 309 in the SAW device 301 are single examples of the second chip. The dummy substrates 29 in the SAW devices 1 and 201 are single examples of the second piezoelectric substrate if they are made of piezoelectric bodies. The piezoelectric substrate 329 in the SAW device 301 is one example of the second piezoelectric substrate. The IDT electrode 37 in the SAW device 301 is one example of the second IDT electrode.

The art in the present disclosure is not limited to the above embodiments and modifications and may be worked in various ways.

The conductors provided in the dummy chip are not limited to the dummy terminals and solid pattern. For example, wirings connecting the two may be provided as well. Further, conductors penetrating through the dummy substrate may be provided as well. The solid pattern may be provided on the other surface as well in place of or in addition to the major surface of the dummy substrate on which the dummy terminals is provided.

The shape of the dummy chip is not limited to a rectangular cuboid shape. For example, it may be given a shape suitable for making the top surface of the resin part flat and/or a shape suitable for heat radiation. For example, the dummy chip may be given a configuration including a heat sink extending outward from a rectangular substrate (rectangular cuboid) as well.

A layer made of another material may be laminated on the top surface of the resin part as well. In this case as well, for example, formation of relief shapes in the layer is suppressed. Further, for example, by substitution of a part of the resin part with the dummy chip, thermal stress generated in the acoustic wave chip is reduced.

REFERENCE SIGNS LIST

1 . . . SAW device (acoustic wave device), 5 . . . mounting substrate, 5a . . . mounting surface, 7 . . . SAW chip (acoustic wave chip, first chip), 9 . . . dummy chip (second chip), 11 . . . resin part, 23 . . . piezoelectric substrate (first piezoelectric substrate), 25 . . . support substrate, 27 . . . dummy terminal, 29 . . . dummy substrate (second piezoelectric substrate), and 37 . . . IDT electrode.

The invention claimed is:

1. An acoustic wave device, comprising:
a mounting substrate comprising a mounting surface,
an acoustic wave chip mounted on the mounting surface,
a dummy chip mounted on the mounting surface, and
a resin part covering the acoustic wave chip and the dummy chip, wherein
the dummy chip comprises
a dummy substrate which is insulating, and
one or more dummy terminals which are located on a surface of the dummy substrate on the mounting surface side and are bonded to the mounting surface, and
the dummy chip configures an open end when electrically viewed from the mounting substrate side,
a material of the dummy substrate is lower in thermal expansion coefficient than a material of the resin part, and
the dummy chip is thicker than the acoustic wave chip.

2. The acoustic wave device according to claim 1, wherein the dummy chip comprises only the one or more dummy terminals as conductors.

3. The acoustic wave device according to claim 1, wherein the dummy chip comprises a solid pattern which is located on the surface of the dummy substrate and is connected to at least one among the one or more dummy terminals.

4. The acoustic wave device according to claim 1, wherein the acoustic wave chip and at least one among the one or more dummy terminals are made conductive through the mounting substrate.

5. The acoustic wave device according to claim 4, wherein:
the acoustic wave chip comprises
an input terminal to which a signal is input,
an output terminal outputting the signal, and
a reference potential terminal given a reference potential, and
the input terminal is made conductive with at least one among the one or more dummy terminals through the mounting substrate.

6. The acoustic wave device according to claim 1, wherein:
the acoustic wave chip comprises a piezoelectric substrate through which an acoustic wave is propagated in a predetermined direction of propagation, and
the dummy chip overlaps the acoustic wave chip when viewed in the direction of propagation.

7. The acoustic wave device according to claim 1, wherein the acoustic wave chip comprises
a piezoelectric substrate,
a support substrate which is bonded to the piezoelectric substrate, which is lower in thermal expansion coefficient than the piezoelectric substrate, and which is thicker than the piezoelectric substrate, and
an IDT electrode located on a surface of the piezoelectric substrate on an opposite side to the support substrate.

8. A communication apparatus, comprising:
the acoustic wave device according to claim 1,
an antenna which is connected with the acoustic wave device, and
an IC which is connected with the acoustic wave device.

9. An acoustic wave device, comprising:
a mounting substrate comprising a mounting surface,
a first chip mounted on the mounting surface,
a second chip mounted on the mounting surface, and
a resin part covering the first chip and the second chip, wherein
the first chip comprises
a first piezoelectric substrate,
a support substrate which is bonded to the first piezoelectric substrate, which is lower in thermal expansion coefficient than the first piezoelectric substrate, and which is thicker than the first piezoelectric substrate, and
a first IDT electrode which is located on a surface of the first piezoelectric substrate on an opposite side to the support substrate and
is mounted on the mounting surface with the first IDT electrode side made to face the mounting substrate, the second chip comprises a second piezoelectric substrate which is thicker than a total thickness of the first piezoelectric substrate and the support substrate, and a top surface of the resin part on an opposite side to the mounting surface is flat over a top of the first chip and a top of the second chip.

10. The acoustic wave device according to claim 9, wherein the second chip comprises one or more dummy terminals which are located on a surface of the second piezoelectric substrate on the mounting surface side and are bonded to the mounting surface and configures an open end when electrically viewed from the mounting substrate side.

11. The acoustic wave device according to claim 9, wherein the second chip comprises a second IDT electrode which is located on a surface of the second piezoelectric substrate on the mounting surface side.

\* \* \* \* \*